United States Patent [19]
Frasch

[11] Patent Number: 5,402,927
[45] Date of Patent: Apr. 4, 1995

[54] ADJUSTABLE WIRE TENSIONING APPARATUS

[75] Inventor: Eugene W. Frasch, Perkasie, Pa.

[73] Assignee: Kulicke and Soffa Investments, Inc., Wilmington, Del.

[21] Appl. No.: 257,063

[22] Filed: Jun. 9, 1994

[51] Int. Cl.⁶ .................. H01L 21/60; B23K 37/00
[52] U.S. Cl. .................... 228/180.5; 228/4.5
[58] Field of Search ............. 228/102, 103, 180.5, 228/212, 4.5, 44.7, 904

[56] References Cited

U.S. PATENT DOCUMENTS

| | | |
|---|---|---|
| 4,498,638 | 2/1985 | Kurtz et al. ............... 242/45 |
| 4,763,826 | 8/1988 | Kulicke, Jr. et al. ........ 228/4.5 |
| 4,909,431 | 3/1990 | Japichino ................. 228/103 |
| 5,016,803 | 5/1991 | Ohashi et al. ............ 228/4.5 |
| 5,114,066 | 5/1992 | Amador et al. ............ 228/4.5 |

Primary Examiner—Samuel M. Heinrich
Attorney, Agent, or Firm—John B. Sowell

[57] ABSTRACT

A multi-level fine wire tensioning apparatus is provided for use in high speed automatic wire bonders. The tensioning apparatus which surrounds the fine wire is mounted close to the bonding capillary and is adapted to apply one of a plurality of tension forces on the wire depending on the phase of the bonding cycle. The tensioning apparatus comprises a housing containing an aspirating tube which applies tension to the fine wire that is threaded through the tube. A controller is coupled to a high speed selector which connects one of a plurality of different level vacuum or pressure sources to the tensioning apparatus which in turn applies different tension forces to the fine wire in the capillary.

11 Claims, 4 Drawing Sheets

ADJUSTABLE WIRE TENSIONING APPARATUS

BACKGROUND OF THE INVENTION

1. Field of the Invention

The present invention relates to fine wire feeding mechanisms of the type used on automatic semiconductor wire bonders. More particularly, the present invention relates to a wire tensioning apparatus used in a wire feed mechanism of an automatic wire bonder.

2. Description of the Prior Art

Heretofore, tensioning devices used to apply tension to a fine wire were known. Such fine wire feed mechanisms for fine wires used in wire bonders are classified in international Class B23K, 37/00 and U.S. Class 228/4.5.

Most of the basic problems associated with feeding fine wires have been recognized heretofore and some solutions have been provided to assure that the fine wire used in automatic wire bonders is isolated from its supply spool and is provided with a back tension or pull at the bonding tool. The fine wire is preferably isolated from a feed spool employing a wire feed slack loop device of the type shown and described in U.S. Pat. No. 4,736,826 which is assigned to the assignee of the present invention. The loop system shown and described in this patent is capable of applying a predetermined tension on a loop of wire leading from a wire spool, thus isolating the wire at the bonding tool from variations and spool movement or friction. Heretofore, tensioning devices have been employed to exert an additional tension force on the wire in a capillary bonding tool which is sufficient to seat a ball in the recess of the bonding tool at first bond. The tension force desired to seat the ball sometimes is in excess of the tension force desired at second bond and a compromise is made in this tension force.

Tests performed to determine a single optimum tension force at first bond have revealed that the operation of an automatic gold wire ball bonder can be enhanced by varying the tension of the wire above the capillary to improve the quality of the wire bonds at both first and second bond as well as increasing the mean time between bonding errors.

Accordingly, it would be desirable to provide a tensioning device that will virtually eliminate known problems associated with improper bonds made by automatic wire bonders.

SUMMARY OF THE INVENTION

It is a principal object of the present invention to provide a novel wire tensioning system having a plurality of tension levels that are selectable during a high speed bonding operation.

It is another principal object of the present invention to provide a wire tensioning device and a wire tensioning system which is shiftable or switchable to different selectable tension levels during high speed bonding operations.

It is another principal object of the present invention to provide a single element wire tensioner which may be employed with positive or negative gas pressures in different environmental conditions to produce desired levels of negative or positive tension at desired times during a bonding operation.

According to these and other objects of the present invention, there is provided a multi-level wire tensioning device mounted on a wire bonder above a bonding tool. The tensioning device is provided with different vacuum/pressure sources which cause a gas flow along a predetermined length of wire to be tensioned. An electromechanical selector is further provided in series with the vacuum or pressure source and is capable of rapidly switching to one of a plurality of different sources so as to effect different tension levels on the fine wire at different steps of a bonding cycle.

DESCRIPTION OF THE PREFERRED EMBODIMENTS

Before discussing the present invention in detail with reference to the drawings, reference is made to a conventional bonding cycle having first and second bonds which are described in U.S. Pat. Nos. 4,266,710 and 4,239,144. These patents describe prior art bonding cycles for automatic ball and wedge fine wire bonders. A state of the art wire feed slack loop device with an air threading mechanism which applies tension to a fine wire is shown in the aforementioned U.S. Pat. No. 4,736,826. U.S. Pat. No. 3,643,321 shows and describes a wire bonder having a tensioning device for despooling fine wire. All four of the above patents are assigned to the same assignee as the present invention. For purposes of utility, it will be understood that the present invention could have been incorporated into such wire bonders and wire feed slack loop systems if previously known and understood.

Figure 1:
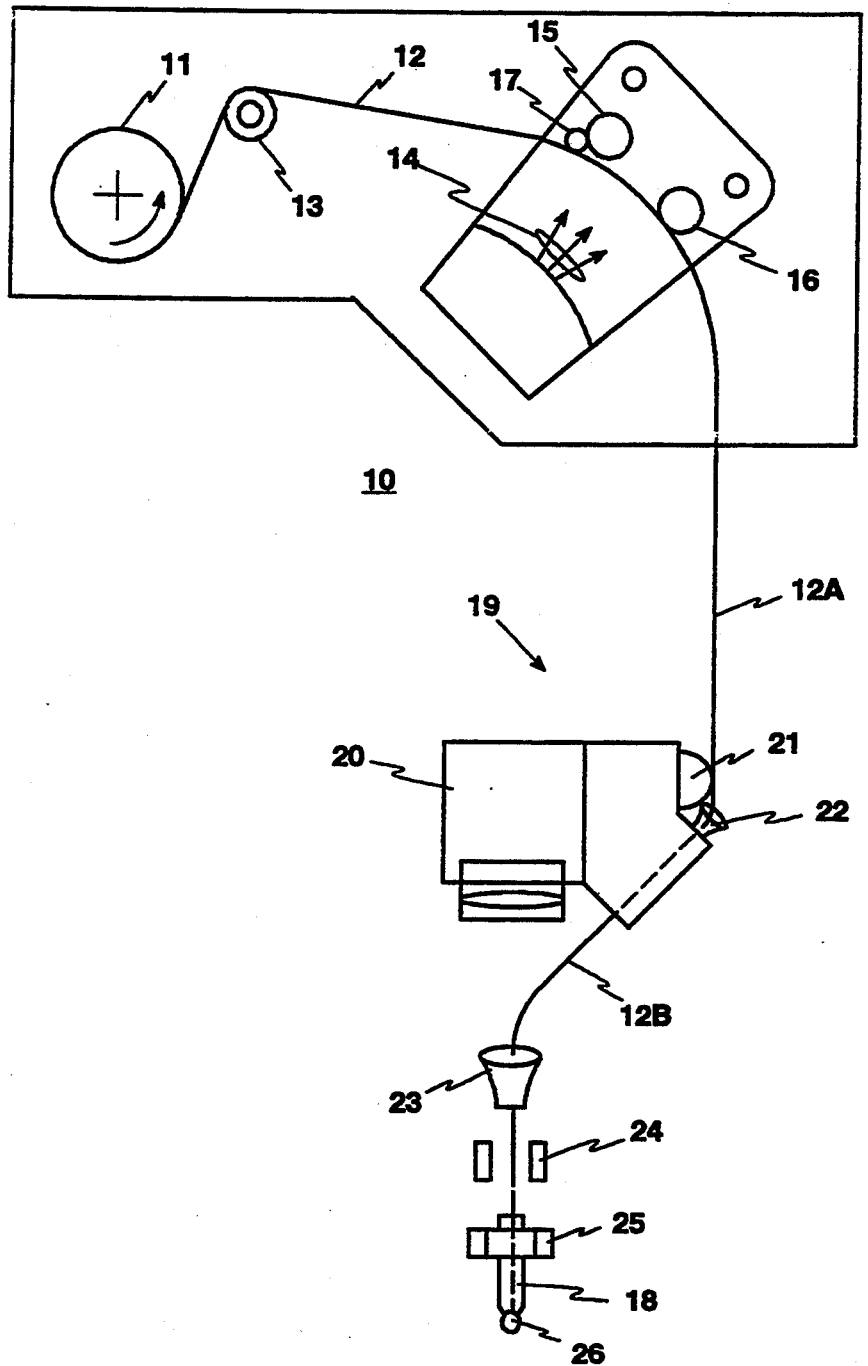
FIG. 1 is a schematic drawing in elevation of a wire feed system showing the path of a fine wire from a wire spool to a bonding capillary.

Refer now to FIG. 1 showing a schematic drawing in elevation of a wire feed system 10 having a spool of fine wire 11 which is despooling a fine wire 12 over a fixed capstan 13. The fine wire 12 is shown urged by a stream of air 14 to form a loose loop which is limited by limits stop 15 and 16. A sensor 17 which may be either optical or electrical contact senses the condition when the loop of the wire is extended to the limit stops 15 and 16. The sensor 17 is coupled to a stepper motor (not shown) which is coupled to a shaft connected to the fine wire spool 11. The known mode of operation includes stepping the stepper motor to supply wire 12 until the loop extends to the sensor 17 at which time the stepper motor is stopped. This loop causes a tension at both ends of the wire 12 which are substantially equal. The end of the wire 12A which leads to the capillary bonding tool 18 is passed through a tensioning device 19 having a smooth block wire guide 21 and a wire funnel 22. The wire 12B after passing through the tensioning device 19 is directed downward through a second funnel 23 and passes through conventional wire clamps 24 before being inserted in the bonding tool 18 which is mounted in the end of a transducer 25. The wire 12 is shown having a ball 26 pulled into the recess of the capillary bonding tool 18 prior to making a first bond. The ball 26 is made on the end of a bonding tail in a conventional manner using either a hot flame or an electronic flame off (EFO). A pattern recognition system (PRS) is provided to locate the target bonding pads and leads of the device being bonded.

Figure 2:
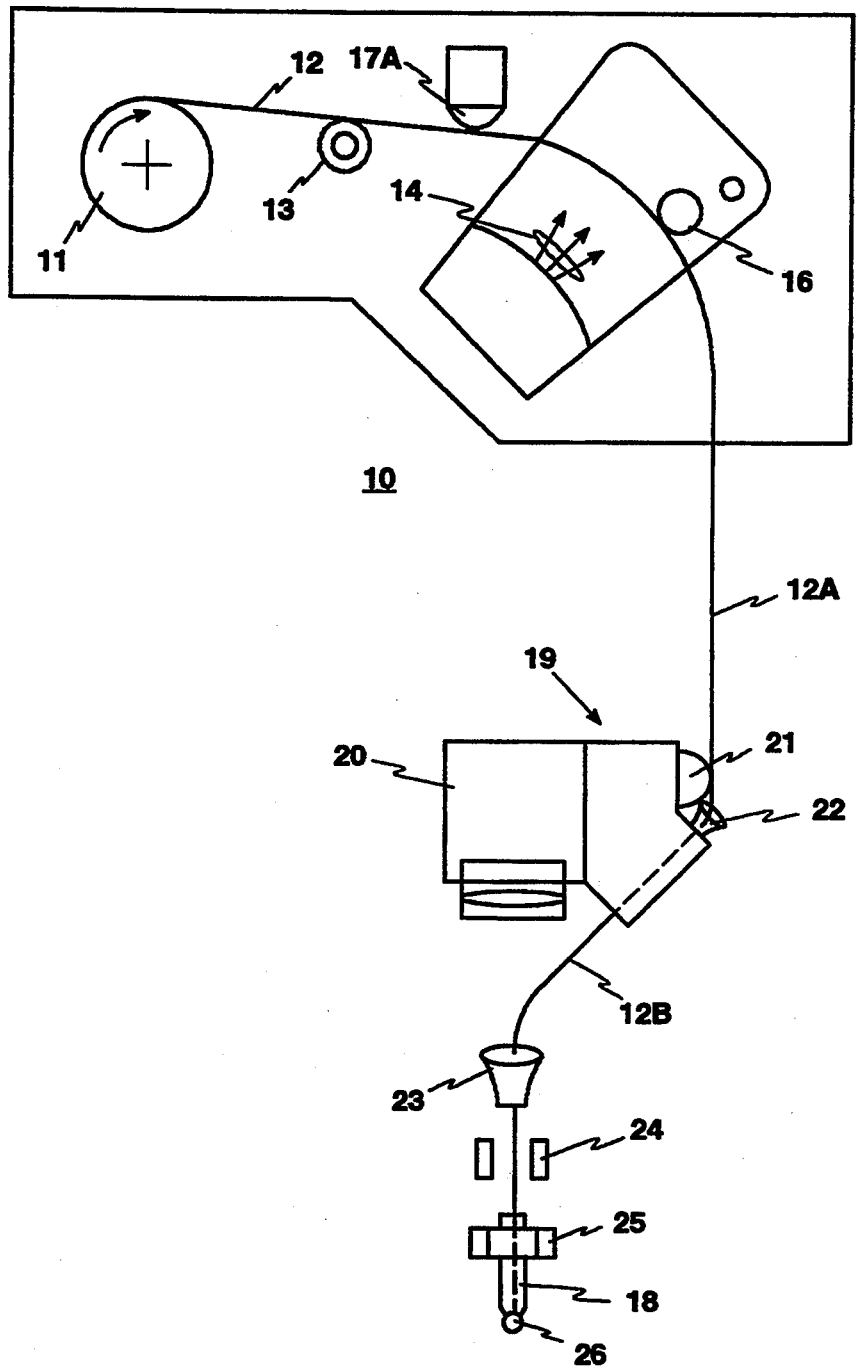
FIG. 2 is a schematic drawing in elevation of a wire feed system similar to FIG. 1 showing a different slack loop path.

Refer now to FIG. 2 which is a schematic drawing in elevation of a wire feed system similar to FIG. 1 showing a different slack loop path. The elements of FIG. 2 which are the same as the elements in FIG. 1 have been numbered the same and will not be discussed in detail herein. The fine wire 12 is shown feeding over the top of the fixed capstan 13 and engaged upon the smooth end of an electrical sensor 17A otherwise the mode of operation of FIG. 2 is the same as that previously described with reference to FIG. 1.

Figure 3:
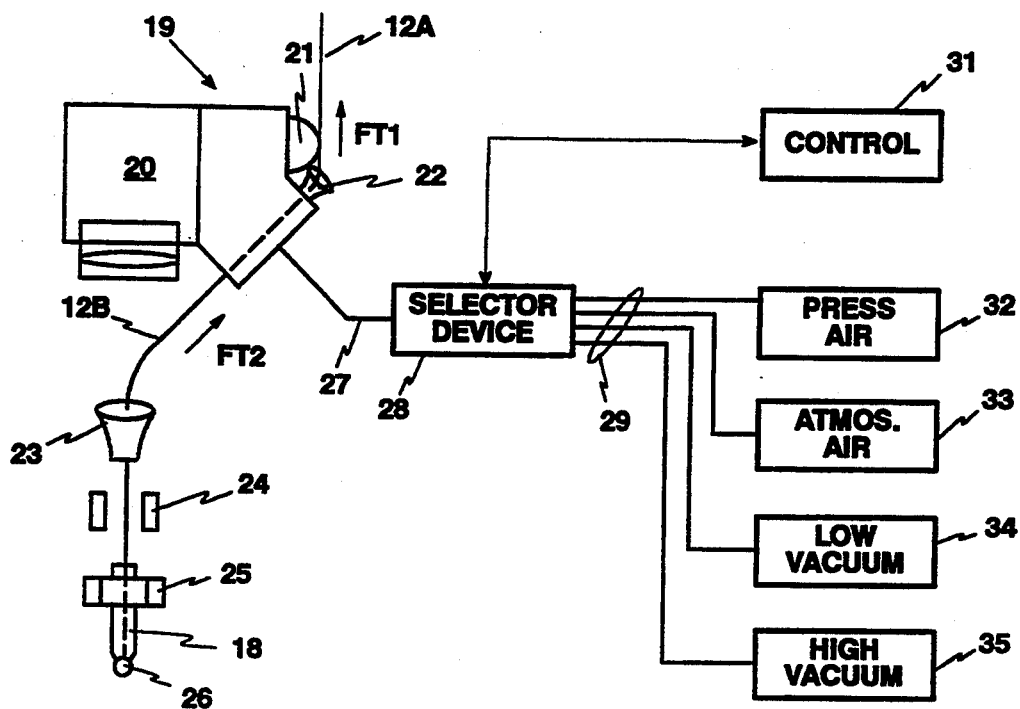
FIG. 3 is a schematic drawing in elevation of the present invention multi-level wire tensioning device employing a plurality of selectable pressurized and vacuum sources.

Refer now to FIG. 3 showing a schematic drawing in elevation of the present invention multi-level wire tensioning device 19 which is coupled by a fluid line 27 to a selector device 28 which has a plurality of ports or selectable lines 29. It will be understood that the selector device 28 is under the electrical control of a control device 31 which in a preferred embodiment wire bonder comprises the computing system of the wire bonder.

In the preferred mode of operation, the wire 12A is tensioned by the slack loop device described hereinbefore to provide a tension force FT1 in the wire portion 12A. The tensioning device 19 adds an additional tensioning force to the wire so that the wire 12B is provided with a tensioning force FT2 which exceeds the tensioning force FT1. For purposes of the present invention description and claims, the force FT2 is much greater than the force FT1 and the force of FT1 can be substantially ignored. The selector device 28 will be described in greater detail hereinafter, and for purposes of this description of FIG. 3 is capable of selecting any one of the sources of air pressure 32–33 or vacuum pressures 34–35. Other sources of air or gas under pressure may be added in the same manner that will be described hereinafter.

Figure 4:
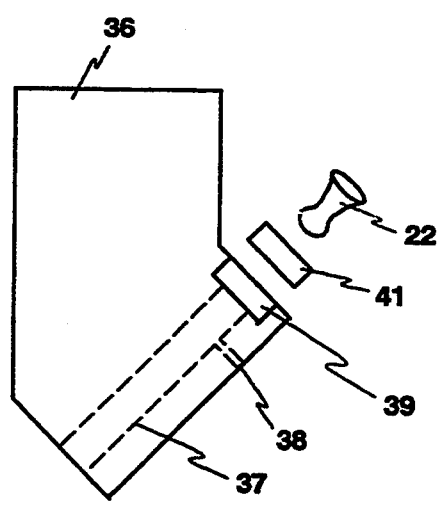
FIG. 4 is a schematic drawing of a prior art mounting block for receiving a wire guide and a tensioning device.

Refer now to FIG. 4 showing a schematic drawing of a prior art mounting block adapted to receive a wire guide tensioning device 42. The mounting block 36 is shown having a cylindrical aperture 37 and a cross drill port 38 which connects to the line 27 described hereinbefore. The expanded aperture 39 is adapted to receive a resilient washer or ring which forms a gasket or holder for the funnel 22.

Figure 5:
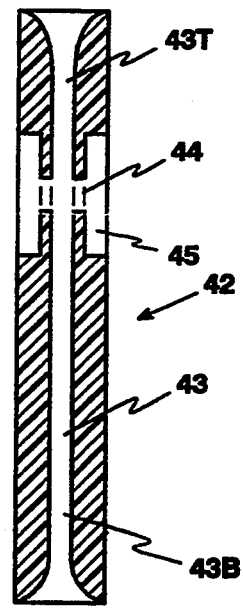
FIG. 5 is an enlarged schematic drawing of a prior art tensioning device of the type used in the mounting block of FIG. 4.

Refer now to FIG. 5 showing an enlarged drawing of a prior art tensioning device tube 42. The tensioning device tube 42 is provided with a smooth bore 43 which connects through cross drill passageways 44 to an annular plenum 45. The annular plenum 45 is positioned opposite the cross drill ports 38 in the aperture 37 so as to connect the fluid or air line 27 to the smooth bore 43. When a vacuum is applied at passageways 44, air flows from the bottom of the tube to the passageway 44. Similarly air is sucked in the top of the tube and exits at the passageway 44. Since the top bore 43T is shorter than the bottom bore 43B, the amount of friction force applied to the wire in the bore 43 is greater in the upward direction than in the downward direction, thus creating a tension force FT2. In the preferred embodiment of the present invention, the top bore 43T may be made of a smaller diameter so as to additionally restrict the amount of opposing tension force in the tensioning tube 42.

Figure 6:
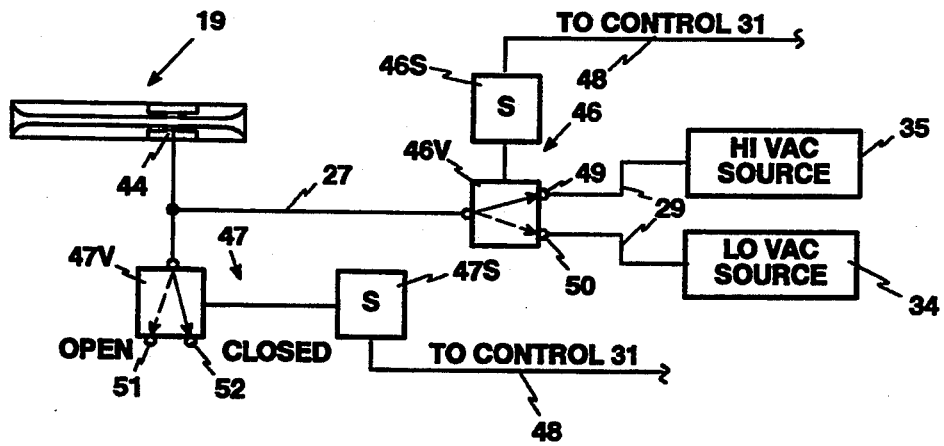
FIG. 6 is a schematic drawing of a fast acting solenoid selector valve.

Refer now to FIG. 6 showing a schematic drawing of a preferred embodiment fast acting solenoid selector valve system 46 and 47 which comprises the selector device 28. The solenoid 46S is coupled by an electrical control line 48 to the aforementioned control 31. The solenoid 46S is capable of connecting the fluid air line 27 to one of two ports 49 or 50 which are connected by fluid air lines 29 to the high vacuum source 35 and low vacuum source 34 described hereinbefore. Thus, it will be understood that the control system 31 is capable of connecting either of two sources 34–35 directly to the line 27 which connects to the passageways 44 described hereinbefore.

It has been found advantageous to use a bleeder valve 47 operated by a solenoid 47S to position a valve 47V to one of two port positions 51 or 52 designated as opened and closed. When the low vacuum source 34 is selected and valve 47V is closed, the low vacuum source is connected to the passageways 44. However, when the valve 47V is positioned to the open port 51, a supply of atmospheric air is coupled to the passageways 44, thus substantially reducing the tension force FT2 to zero. If only two levels of pressure are desired, it is possible to connect the high vacuum source 35 or low vacuum source 34 directly to line 27 and passageway 44. Then when the single valve 47 is operated, the second level of air or vacuum supply is substantially zero.

Figure 7:
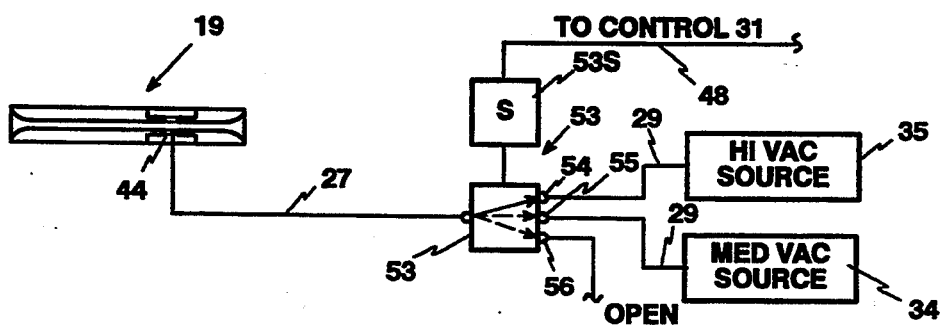
FIG. 7 is a schematic drawing of another fast acting solenoid selector valve system.

Refer now to FIG. 7 showing a schematic drawing of another fast acting three position solenoid selector valve comprising a solenoid 53S controlled via a control line 48 coupled to the control 31. The three position valve 53V has its three ports 54 through 56 connected to three different levels of vacuum or air as shown, thus, the single selector device shown as valve 53 is capable of connecting three different tensioning force levels to the line 27 and the passageway 44.

Figure 8:
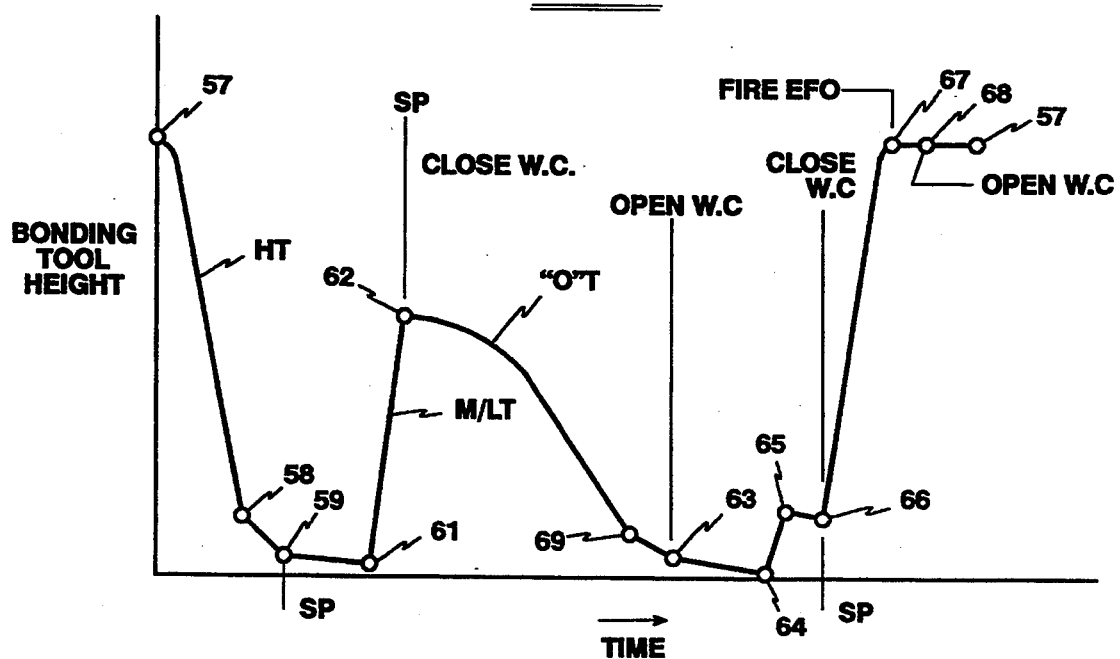
FIG. 8 is a schematic drawing showing the height displacement of a bonding capillary versus time during a bonding cycle.

Refer now to FIG. 8 showing a schematic drawing of a bonding cycle in which the height displacement of the bonding tool 18 is plotted versus time. The bonding cycle of an automatic wire bonder starts at the reset point 57 and has a ball 26 present on the wire 12 prior to making a descent to the first bond. During the descent to first bond, a high tension force (HT) is preferably applied to the wire 12B to seat the ball 26 in the capillary 18. At point 58 the high velocity descent of the capillary starts a linear velocity approach to the touchdown point 59. The touchdown point 59 is used as a shift point wherein the high tension force may be now changed into a low tension or medium tension force by the time the bond is complete at the point 61. The bonding tool 18 rises off of first bond to a loop height 62 at which time the wire clamps are now closed and it is possible to start another shift point. At shift point 62 it is preferred that the wire tension force FT2 on the wire 12B be reduced to substantially zero. The bonding tool then descends toward second bond and its transition point 69 where linear velocity occurs until a touchdown at point 63 is reached. At point 63 the wire clamps are now preferably opened or performing a second bond. At point 64 the second bond is complete and the bonding tool 18 is down on the substrate (not shown). The bonding tool is raised to point 65 paying out a tail of wire with the wire clamps open. The bonding tool stops the ascent between point 65 and 66 at which time the wire clamps are closed and further ascent will pull the wire tail loose from the second bond. The wire clamps remain closed from point 66 until they reach the reset height 57. After the electronic flame off forms the new ball at point 67, then the wire clamps are opened at point 68. The ball formed on the wire 12 is below the recess of the bonding tool 18 at the new reset point 57. It will be noted that at point 66 when the wire clamps are closed, it is best to start the shift point from zero tension or low tension to high tension which is required at the reset point 57. Since the wire clamps are closed between points 66 and 68, the tension at this point does not have any effect on moving the wire. It is not until the wire clamps are opened at point 68 and the bonding tool 18 starts its descent that the ball 26 is capable of fully seating in the recess of the bonding capillary 18.

Having explained a preferred embodiment and a modification of the present invention using fast acting solenoids it will be appreciated that the complete bonding cycle for performing first and second bonds is now being performed in state of the art automatic wire bonders at around 100 milliseconds and that the state of the art solenoids employed in the selector devices to be fully effective switches in less than 12 milliseconds. Until the state of the art selector valves become faster, it may be necessary to anticipate the required shift points.

Heretofore, automatic wire bonders could be expected to have as many as 20 errors or occurrences per million operations which affected the seating of the ball in the capillary or the tail at second bond would break prematurely which would affect the size of the ball or create a condition of no ball causing the automatic wire bonder to stop. By applying a slight positive (push) force FT2 at second bond it is possible to assure that the wire tail remains in contact with the substrate and does not break prematurely before the wire clamps close. The correct length tail may then be severed. Further, it is now possible to create a much stronger tension force FT2 to seat the ball prior to a next first bond operation because this high tension force is different from the low tension force needed for the bonding operation at second bond and subsequent operations. While not shown, it is also possible to create a system of metering valves or adjusting valves so that critical adjusted amounts of vacuum or pressure can be applied to the line 27. However, it has not been found necessary to design this additional cost into the novel selector devices because the necessary tension forces may be built into the machine and made permanent rather than adjustable which could create a condition for future malfunction.

What is claimed is:

1. A multi-level wire tensioning apparatus, comprising:
   a housing having a passageway therein,
   an aspirating tube in said passageway of said housing,
   said aspirating tube having a cylindrical wire guide for receiving a fine wire and for applying a tension force thereto,
   an aspirating gas line connected to said aspirating tube,
   selector means connected to said aspirating gas line, and
   a plurality of different gas pressure sources connected to said selector means and individually selectable by said selector means to provide a plurality of selectable tensions on said fine wire.

2. Apparatus as set forth in claim 1 wherein said selector means comprises a fast acting solenoid.

3. Apparatus as set forth in claim 2 wherein said fast acting solenoid comprises a plurality of selectable ports each connectable to a different one of said different gas pressure sources.

4. Apparatus as set forth in claim 1 wherein said selector means comprises a plurality of fast acting solenoids connectable to different ones of said different gas pressure sources.

5. Apparatus as set forth in claim 1 wherein said selector means further includes a high tension port and a low tension port.

6. Apparatus as set forth in claim 5 which further includes control means for switching said selector means from a high tension to a low tension port during a first bond operation.

7. Apparatus as set forth in claim 5 which further includes control means for switching said selector means from a low tension port to a high tension port after completing a second bond.

8. Apparatus as set forth in claim 1 wherein said plurality of different gas pressure sources comprise a high vacuum source and a low vacuum source.

9. Apparatus as set forth in claim 8 wherein said low vacuum source is at approximately atmospheric pressure.

10. A method of controlling a multi-level wire tensioner during a bonding cycle, comprising the steps of:
    placing a controllable tensioning device in the path of a fine wire leading to a capillary bonding tool on an automatic wire bonder,
    placing a high tension on said fine wire before a first bond to force a ball on the wire into a recess in the bonding tool,
    shifting from a high tension to a low tension on the fine wire upon completion of the first bond,
    maintaining some tension on said fine wire while moving from a first bond position to a second bond position, and
    shifting from a low tension at second bond position to a high tension on said fine wire to place said high tension on said fine wire before the next first bond.

11. A method as set forth in claim 10 which further includes the step of shifting from said low tension at said second bond to a negative tension while raising said bonding tool to a tail height and subsequently shifting to said high tension on said fine wire before a next first bond.

* * * * *